US012560644B2

(12) United States Patent
Pletner et al.

(10) Patent No.: US 12,560,644 B2
(45) Date of Patent: Feb. 24, 2026

(54) SYSTEM FOR TESTING USER EQUIPMENT

(71) Applicant: Keysight Technologies, Inc., Santa Rosa, CA (US)

(72) Inventors: Maxim Pletner, Santa Clara, CA (US); Ailee Grumbine, Colorado Springs, CO (US); Karamveer Singh, Deer Park, NY (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 303 days.

(21) Appl. No.: 18/384,993

(22) Filed: Oct. 30, 2023

(65) Prior Publication Data

US 2025/0138079 A1 May 1, 2025

(51) Int. Cl.
| | |
|---|---|
| *G01R 31/28* | (2006.01) |
| *G06F 11/263* | (2006.01) |
| *H04B 17/391* | (2015.01) |
| *H04L 12/24* | (2006.01) |
| *H04L 12/26* | (2006.01) |
| *H04L 29/06* | (2006.01) |

(52) U.S. Cl.
CPC ..... *G01R 31/2822* (2013.01); *H04B 17/3912* (2015.01)

(58) Field of Classification Search
None
See application file for complete search history.

(56) References Cited

U.S. PATENT DOCUMENTS

| | | | |
|---|---|---|---|
| 7,072,825 B2 * | 7/2006 | Wang | G06F 11/261 |
| | | | 703/21 |
| 7,107,049 B2 * | 9/2006 | Barberis | H04W 24/00 |
| | | | 455/423 |

(Continued)

FOREIGN PATENT DOCUMENTS

WO      2017/142393 A1      8/2017

OTHER PUBLICATIONS

Zhimei Jiang et al., "A Subjective Survey of User Experience for Data Applications for Future Cellular Wireless Networks," Proceedings 2001 Symposium on Applications and the Internet, San Diego, CA, USA, 2001, pp. 167-175.

*Primary Examiner* — Tuan A Tran

(57) ABSTRACT

A system for testing a cellular device under test (DUT) includes a display device for displaying a mirror image of a screen of the cellular DUT, and a network emulator configured to emulate a cellular network while in communication with the cellular DUT. The system further includes a sequencer engine module, including a graphical user automated testing interface displayed on the display device together with the mirror image of the screen of the cellular DUT, configured to control the network emulator and the cellular DUT, to automatically run a sequence of test commands on the cellular DUT, and to automatically run user emulation scripts. The system further includes a user emulation module configured to emulate a graphical user interface of the DUT by generating the user module scripts according to the sequence of test commands. The system further includes a data analytics module configured to generate display data of measurement results of the DUT on the display device.

13 Claims, 13 Drawing Sheets

(56)                References Cited

U.S. PATENT DOCUMENTS

| | | | | |
|---|---|---|---|---|
| 7,188,063 B1 * | 3/2007 | Snyder | | G06F 30/331 |
| | | | | 703/27 |
| 7,363,567 B2 * | 4/2008 | Rands | | G06F 11/263 |
| | | | | 714/739 |
| 8,150,675 B1 | 4/2012 | Ortmanns et al. | | |
| 8,589,140 B1 * | 11/2013 | Poulin | | G06F 8/30 |
| | | | | 703/22 |
| 8,743,735 B1 * | 6/2014 | Bershteyn | | H04L 12/4633 |
| | | | | 370/254 |
| 9,001,688 B2 * | 4/2015 | Dragulescu | | H04L 47/11 |
| | | | | 370/252 |
| 9,009,677 B2 | 4/2015 | Zhao et al. | | |
| 9,172,647 B2 * | 10/2015 | Chew | | H04L 43/50 |
| 9,329,960 B2 * | 5/2016 | Chattopadhyay | | H04L 41/145 |
| 9,380,297 B1 * | 6/2016 | Djurdjevic | | H04N 17/004 |
| 9,397,901 B2 * | 7/2016 | Majumdar | | H04L 43/028 |
| 9,426,284 B2 * | 8/2016 | Prewitt, II | | H04M 3/362 |
| 9,547,041 B2 * | 1/2017 | Siva | | G01R 31/31727 |
| 9,553,786 B2 * | 1/2017 | Bergeron | | H04L 43/0876 |
| 9,591,300 B2 * | 3/2017 | Djurdjevic | | H04N 25/61 |
| 9,654,303 B2 * | 5/2017 | Joyner | | H04L 12/4633 |
| 9,712,406 B2 * | 7/2017 | Chu | | H04L 43/50 |
| 9,749,213 B2 * | 8/2017 | Gintis | | H04L 43/50 |
| 9,774,618 B2 * | 9/2017 | Sundhar | | H04W 12/125 |
| 9,778,315 B2 * | 10/2017 | Siva | | G06F 11/364 |
| 9,817,067 B2 * | 11/2017 | Patel | | G06F 11/261 |
| 10,082,538 B2 * | 9/2018 | Siva | | G01R 31/31727 |
| 10,288,681 B2 * | 5/2019 | Champoux | | G01R 31/31908 |
| 10,484,056 B2 * | 11/2019 | Garcia | | H04W 72/0446 |
| 10,540,466 B1 * | 1/2020 | Kfir | | G06F 30/331 |
| 10,735,110 B2 * | 8/2020 | Devarasetty | | H04B 17/391 |
| 10,841,026 B2 * | 11/2020 | Dhananjay | | H03H 17/06 |
| 10,868,730 B2 * | 12/2020 | Mozumdar | | H04L 43/20 |
| 11,009,550 B2 * | 5/2021 | Champoux | | G01R 31/31907 |
| 11,063,752 B2 * | 7/2021 | Cipu | | H04L 63/164 |
| 12,184,505 B2 * | 12/2024 | Johnston | | H04L 41/145 |
| 2011/0282642 A1 | 11/2011 | Kruger et al. | | |
| 2014/0269386 A1 * | 9/2014 | Chu | | H04L 63/08 |
| | | | | 370/252 |

* cited by examiner

| Name | Verdict | Duration | Flow | Type |
|---|---|---|---|---|
| ☒ 7515B-5G-NR Export / Import | | ⊐ | | E7515B-5G-NR \ 5GNR BSE \ Utils \ Export / Import |
| ☒ E7515B-5G-NR Log Control | | ⊐ | | E7515B-5G-NR \ General \ Logging \ Log Control |
| ☒ DUT Action - FlightModeOn | | ⊐ | | DUT_UE \ DUT Action |
| ☒ E7515B-5G-NR.Activate Cell 1 | | ⊐ | | E7515B-5G-NR \ General \ Cell Actions \ BSE Procedures \ Activate Cells |
| ☒ DUT Action - FlightModeOFF | | ⊐ | | DUT_UE \ DUT Action |
| ☒ E7515B-5G-NR.LTE.Wait BSE State - CELL 1 - ON | | ⊐ | | E7515B-5G-NR \ LTE BSE \ Cell Actions \ BSE Procedures \ Wait BSE State |
| ☒ Eggplant Script | | ⊐ | | Eggplant \ Eggplant Script |
| ☒ Loading CSV report | | ⊐ | | Eggplant \ Loading CSV report |
| ☒ E7515B-5G-NR.Activate Cell 2 | | ⊐ | | S7515B-5G-NR \ General \ Cell Actions \ BSE Procedures \ Activate Cells |
| ☒ E7515B-5G-NR.LTE.UE capability Enquiry | | ⊐ | | E7515B-5G-NR \ LTE BSE \ Cell Setup \ RRC-NAS \ UE Capability Enquiry |
| ☒ Eggplant Script - 2 | | ⊐ | | Eggplant \ Eggplant Script |
| ☒ Loading CSV report - 2 | | ⊐ | | Eggplant \ Loading CSV report |
| ☒ DUT Action - FlightModeOn | | ⊐ | | DUT_UE \ DUT Action |

FIG.5

| Test Step Settings | | ? ⌄ ✕ |
|---|---|---|
| ⌄ Input | | |
| Script File Path | ..\..\..\Users\Administration\Desktop\Test Automation\SpeedTest | ... ⌷ |
| Parameters | SM S908U1 | |
| Timeout | 40000 ms | |
| ⌄ Common | | |
| Enabled | ☑ | |
| Step Name | Eggplane Script - 2 | |
| Break Conditions | ☐ Break on Error | ⌄ |
| Description | A simple script loading | |

FIG.6

```
⊗ ⬧ SpeedTest

▷  ▷≡  🅀  ⊕  ▱  │Insert...  ▾│ to SpeedTest params SUTName
    Connect SUTName

Wait 2
    SpeedTestFunction

//NOTE: Script assumes that the SpeedTest app is on the home screen
    //MUST modify script if this is not the case
    on SpeedTestFunction
        PressHomeButton
        Click(imageName:"SpeedTest_AppIcon", WaitFor:30)

//Wait for app to load and then start the speed test
        WaitFor 60, "SpeedTest_Logo"
        if imageFound(imageName:"Exit_results", WaitFor:0)
            Click foundImageLocation()
        end if
        Click(text:"GO", ValidCharacters:"", WaitFor:30)

//Wait for test to finish and log the speeds
        WaitFor 300, text:"Tst Again"
        LogSpeeds
    end SpeedTestFunction on LogSpeeds
        set temp to imageRectangle(text:"DOWNLOAD", caseSensitive:YES)

//First, read if download was in Mbps or kbps
        set UL to topRight(temp)-[2,2]
        set LR to (x of remotescreensize()/2, bottom(temp))+[2,2]
        set DLscale to readText(UL, LR, validCharacters:"kMGTbps")

//Second, read download speed
        set UL to bottomLeft(temp)
        set LR to (x of remotescreensize()/2, top(imageRectangle(text:"Ping")))
        set DLspeed to readText(UL, LR)
        log "Download Speed: "&DLspeed&" "&SLscale set temp to imageRectangle(text:"UPKOAD", caseSensitive:Yes)
        //Third, read if upload was in Mbps or kbps
        set UL to topRight(temp)-[3,3]
        set LR to (x of remotescreensize(), bottom(temp))+[0,5]
        set ULscale to readText(UL, LR, validCharacters:"kMGTbps")

//Fourth, read upload speed
        set UL to bottomLeft(temp)
        set LR to (x of remotescreensize(), top(imageRectangle(text:"Ping")))
        set ULspeed to readText(UL, LR)
        log "Upload Speed: "&ULspeed&" "&ULscale set myFile to ResourcePath("SpeedTestResults.csv")
        put the international time&","&DLspeed&","&DLscale&","&ULspeed&","&ULscale&return after file myFile end LogSpeeds Output │ ✳ Script Checker: WARNINGS: 6 │                    │Check Script││Check All...│
```

FIG.7

| Test Step Settings | ? ⌄ ✕ |
|---|---|

⌄ Common Settings

| Cell Type | NR5G | ⌄ |
|---|---|---|
| Cells | CELL1 | ⌄ |

⌄ Cell ON/OFF

| Cell ON/OFF | OFF | ⌄ |
|---|---|---|

⌄ Common

| 5G BSE | | ⌄ |
|---|---|---|
| Enabled | ☑ | |
| Step Name | E7515B-5G-NG.Activate Cells | |
| Break Conditions ☐ | Break Conditions | ⌄ |
| Description | Action to apply to selected cell(s) [ON], [OFF]. (Default: ON) | |

FIG.9

```
2023-06-21 13:55:09.491831 ; 5G HCCU1 ; Debug       ; SCPI >> *IDN? [128 us]
2023-06-21 13:55:09.491831 ; 5G HCCU1 ; Debug       ; SCPI << Keysight Technologies,hislipHCCU,0,2.9.7.7
2023-06-21 13:55:09.491831 ; 5G HCCU1 ; information ; Now connected to: Keysight Technologies,hislipHCCU,0,2.9.7.7
2023-06-21 13:55:09.491831 ; 5G HCCU1 ; Debug       ; SCPI >> *CLS [38.9 us]
2023-06-21 13:55:09.492830 ; 5G HCCU1 ; Debug       ; SCPI >> :SYSTem:SETup? [1.06 ms]
2023-06-21 13:55:09.492830 ; 5G HCCU1 ; Debug       ; SCPI << "TSPC_1UXM5G_LF"
2023-06-21 13:55:09.493826 ; 5G HCCU1 ; Debug       ; SCPI:SETup:INSTrument:COUNt? [1.36 ms]
2023-06-21 13:55:09.493826 ; 5G HCCU1 ; Debug       ; SCPI << 2
2023-06-21 13:55:09.495821 ; 5G HCCU1 ; Debug       ; SCPI >> :SETup:INSTrument:NAMe? 0 [1.50 ms]
2023-06-21 13:55:09.495821 ; 5G HCCU1 ; Debug       ; SCPI << "NE_1"
2023-06-21 13:55:09.496819 ; 5G HCCU1 ; Debug       ; SCPI >> :SETup:INSTrument:NAMe? 1 [1.29 ms]
2023-06-21 13:55:09.496819 ; 5G HCCU1 ; Debug       ; SCPI << "TSPC"
2023-06-21 13:55:09.497817 ; 5G HCCU1 ; Debug       ; SCPI >> :SYSTem:SETup? [1.16 ms]
2023-06-21 13:55:09.497817 ; 5G HCCU1 ; Debug       ; SCPI << "TSPC_1UXM5G_LF"
2023-06-21 13:55:09.618495 ; 5G BSE1  ; Debug       ; Connecting to TCPIP0::127.0.0.1::hislip2::INSTR"
2023-06-21 13:55:09.636446 ; 5G BSE1  ; Debug       ; SCPI >> *IDN? [354 us]
2023-06-21 13:55:09.636446 ; 5G BSE1  ; Debug       ; SCPI <<Keysight Technologies,C8700200A Test Application Framework,MY22487110,21.4.2.3301
2023-06-21 13:55:09.636446 ; 5G BSE1  ; information ; Now connected to: Keysight Technologies, C8700200A Test Application Framework,MY22487110,21.4.2.3301
2023-06-21 13:55:09.636446 ; 5G BSE1  ; Debug       ; SCPI>>*CLS [40.8 us]
2023-06-21 13:55:09.636446 ; 5G BSE1  ; Debug       ; SCPI>>*OPC? [475 us]
2023-06-21 13:55:09.636446 ; 5G BSE1  ; Debug       ; SCPI<<1
2023-06-21 13:55:09.636446 ; 5G BSE1  ; Debug       ; SCPI:BSE:FUNCtion:MESSage:CLEar [38.8 us]
2023-06-21 13:55:09.640436 ; 5G BSE1  ; Debug       ; SCPI>>*OPC? [3.12 ms]
2023-06-21 13:55:09.640436 ; 5G BSE1  ; Debug       ; SCPI<<1
2023-06-21 13:55:09.640436 ; 5G BSE1  ; Debug       ; SCPI>>DISP:SCR SYSTem,MESSage [44.3 us]
2023-06-21 13:55:09.641433 ; 5G BSE1  ; Debug       ; SCPI>>*OPC? [1.73 ms]
2023-06-21 13:55:09.641433 ; 5G BSE1  ; Debug       ; SCPI<<1
```

FIG. 10

SYSTEM FOR TESTING USER EQUIPMENT

BACKGROUND

As the adoption of 5G technology and associated use cases accelerates, it is crucial to ensure seamless operation of User Equipment (UE) and its synchronization with the 5G network state. The task is not just about detecting issues but also identifying the root causes to provide a solid foundation for robust solutions. Traditional commands and interfaces can still be effective for tracking certain performance metrics. However, to fully comprehend the system performance and application interactions, there is a clear need for emulating real user experience.

In the current environment of network design and analysis, professionals face a fragmented ecosystem of tools that create significant operational hurdles. One segment of these tools is aimed at automating the user interface and user experience, leveraging application programming interfaces (APIs) to perform tasks. Another segment is designed for automating measurement hardware and low-level device-under-test operations, heavily reliant on graphical simulation techniques. These two distinct facets follow separate paths, operate on different principles, and seldom intersect. Furthermore, the data generated by these disparate tools typically lack centralization, making correlation and analysis a complex task. The ability to couple network events with user actions is hampered by the lack of seamless data integration, creating a gap in understanding the full picture of system operation. Thus, the manual and time-consuming process of gathering necessary information from these distinct systems not only hinders productivity, but also obstructs a holistic view of network design, testing, and analysis.

SUMMARY

According to an aspect of the inventive concepts, a system for testing a cellular device under test (DUT) is provided and includes a display device for displaying a mirror image of a screen of the cellular DUT, and a network emulator configured to emulate a cellular network while in communication with the cellular DUT. The system further includes a sequencer engine module, including a graphical user automated testing interface displayed on the display device together with the mirror image of the screen of the cellular DUT, configured to control the network emulator and the cellular DUT, to automatically run a sequence of test commands on the cellular DUT, and to automatically run user emulation scripts. The system further includes a user emulation module configured to emulate a graphical user interface of the DUT by generating the user module scripts according to the sequence of test commands. The system further includes a data analytics module configured to generate display data of measurement results of the DUT on the display device.

The user emulation module may be configured to scan the mirror image of the screen of the DUT for specified input graphics, and to selectively activate the specified input graphics on the DUT according to the user emulation scrips. The user emulation module may be further configured to scan the mirror image of the screen of the DUT for test results applied to the data analytics module.

The DUT may be an Android device which is controllable by either the sequencer engine module or the user emulation module. Alternatively, the DUT is an IOS device controlled by the user emulation module.

The system may further include a test computer including the display. The sequencer engine module, the user emulation module and the data analytics module may be loaded in memory of the test computer. Alternatively, the sequencer engine module may be loaded in memory of the test computer, and the user emulation module and the data analytics module may be on a webserver.

According to another aspect of the inventive concepts, a non-transitory computer readable medium is provided having stored thereon executable instructions embodied in the computer readable medium that when executed by at least one processor of a computer cause the computer to perform steps to test a cellular device under test (DUT), where the executable instructions include a sequencer engine module, a user emulation module, and a data analytics module. The sequencer engine module includes a graphical user automated testing interface to be displayed on a display device together with a mirror image of a screen of the cellular DUT, and when executed by the at least one processor, controls the network emulator and the cellular DUT, automatically runs a sequence of test commands on the cellular DUT, and automatically runs user emulation scripts. The user emulation module, when executed by the at least one processor, emulates a graphical user interface of the DUT by generating the user emulation scripts according to the sequence of test commands. The data analytics module, when executed by the at least one processor, generates display data of measurement results of the DUT on the display device.

The user emulation module, when executed by the at least one processor, may scan the mirror image of the screen of the DUT for specified input graphics, and selectively activate the specified input graphics on the DUT according to the user emulation scrips. The user emulation module, when executed by the at least one processor, may further scan the mirror image of the screen of the DUT for test results applied to the data analytics module.

The DUT may be an Android device which is controllable by either the sequencer engine module or the user emulation module. Alternatively, the DUT is an IOS device controlled by the user emulation module.

BRIEF DESCRIPTION OF THE DRAWINGS

The above and other aspects and features of the inventive concepts will become readily apparent from the detailed description that follows, with reference to the accompanying drawings, in which:

FIG. 5 illustrates an example test plan which emulates the change in network performance when the main cell is switched from LTE to 5G;

FIG. 6 illustrates an example in which the network speed is tested;

FIG. 7 illustrates an example of scripts used in a speed test;

FIG. 9 illustrates an example of a test step activating a 5G cell;

FIG. 10 illustrates an example of part of a log associated with cell configuration;

DETAILED DESCRIPTION

Emulating real user experiences requires a multifaceted approach, that not only ensures smooth UE operation and network state synchronization but also integrates aspects such as power consumption, spectral efficiency, and interference into the testing mechanism. Furthermore, by focusing on tracking only the necessary metrics, one can optimize the process, reduce noise, and make the data more manageable. Visualizing and analyzing these metrics can help us understand patterns, spot anomalies, and make informed decisions. At least some of the embodiments described herein aim to bring together all these elements to create a comprehensive solution that enhances the user experience and the overall performance of the 5G network.

The inventive concepts construct a complete framework that leverages, as examples, PathWave® Test Automation software, the Eggplant solution utilizing Automation Intelligence (AI), and PathWave® Measurement Analytics, each from Keysight Technologies. The inventive concepts uniquely address an array of challenges in the cellular network performance testing in application-oriented domain sphere by consolidating various use case emulation, measurement automation, and data analytics into one centralized environment.

Figure 1:
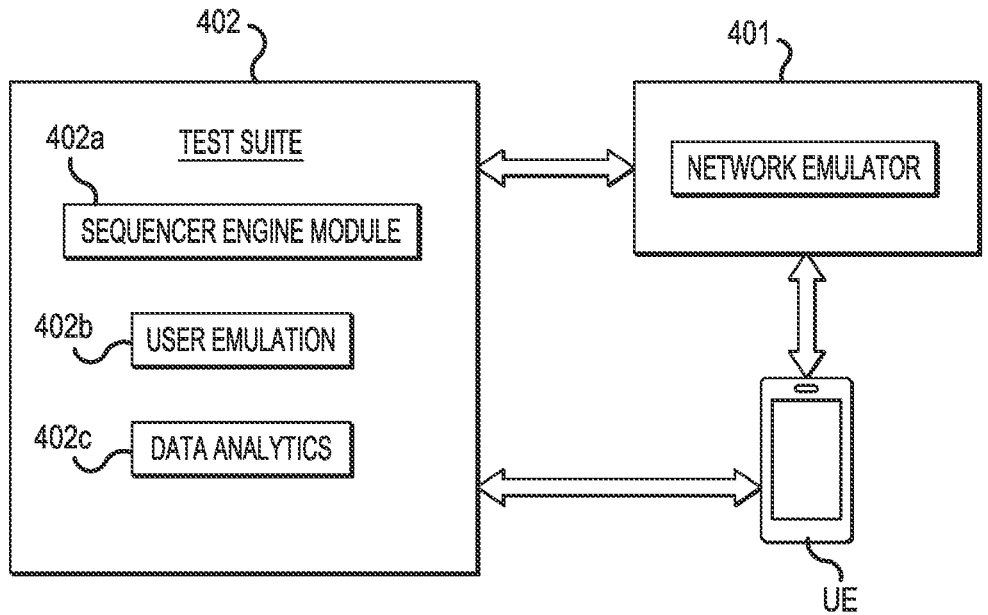
FIG. 1 is schematic diagram of a test setup according to embodiments of the inventive concepts.

FIG. 1 is a simplified schematic diagram a test set-up according to embodiments of the inventive concepts. Generally, the embodiments include a network emulator 401 and a suite 402 of test software for testing a user equipment (UE). As shown, the test suite includes a sequencer engine module 402*a*, a user emulation module 402*b* and a data analytics module 402*c*.

Path Wave® Test Automation software is an example of the sequencer engine module 401*a*. As will be described herein, the sequencer engine module 401*a* of at least some embodiments includes a graphical user automated testing interface for display on a display device together with a mirror image of the screen of a cellular DUT, and is configured to control a network emulator and the cellular DUT, to automatically run a sequence of test commands on the cellular DUT, and to automatically run user emulation scripts.

Eggplant is an example of the user emulation module 402*b*. The user emulation module 402*b* of at least some embodiments is configured to emulate a graphical user interface of the DUT by generating the user emulation scripts according to the sequence of test command.

Path Wave® Measurement Analytics is an example of the data analytics module 402*c*. The data analytics module 402*c* according to at least some embodiments is configured to generate display data of measurement results of the DUT on the display device.

The inventive concepts are described below in the context of implementations leveraging the Path Wave® Test Automation, Eggplant and Path Wave® Measurement Analytics set of tools offered by Keysight Technologies. However, it is stressed that the inventive concepts are not limited to the use of this particular toolset. Rather, the inventive concepts encompass other sequencer engine modules, other user emulation modules and other data analytics modules configured as recited in the appended claims.

Prior to a description of the embodiments, some key functionality achievable from the inventive concepts are briefly discussed.

Unified Platform for 5G Application Use Cases Emulation: The inventive concepts provide a one-stop platform where engineers can initiate different use case emulations such as file transfers or streaming (e.g., YouTube®), video calls (WhatsApp® or FaceTime®), network speed testing (Speedtest®) with sophisticated control of network emulators, RF hardware and 5G cellular applications. This centralization simplifies the emulation process and enhances its efficiency.

Automate User Experience Testing: The Eggplant toolset integration as described herein replicates user behavior and ensures repeatable application interactions, automating the testing of the user interface and experience.

Automate Measurement Hardware and Device Control: Using Path Wave® Test Automation's existing plugin architecture in the manner described herein, the inventive concepts facilitate automated communication with measurement hardware and enables low-level control of the device-under-test.

Centralized Data Management: The framework of at least some embodiments directs all collected data from user experience testing, device-under-test automation, and measurement hardware parameters to a centralized dataset within PathWave® Measurement Analytics. This integration ensures easy access to data and upholds data integrity.

Comprehensive Analysis Capabilities: With centralized data, the inventive concepts offer comprehensive visualization of collected KPIs, enabling the identification of correlations between network events and user activities. This offers a holistic understanding of system performance.

Coupling of Measurement Results: The inventive concepts enable coupling of measurement results, linking specific user activities to network performance. This comprehensive view can be instrumental in optimizing the system.

Embodiments of the inventive concepts will now be described.

Initially, a test and measurement environment is configured. Here, prior to running the complete automated workflow, the user may need to configure a Path Wave® Test Automation environment using, for example, OpenTAP® core engine. First, in some embodiments, the user may need to install and deploy a development version of PathWave® Test Automation designated by Keysight Technologies as KS8400B. In this case, the user needs to ensure KS8400B Test Automation interoperability with Eggplant Tools, a network emulator (e.g., UXM 5G Network Emulator), PathWave® Measurement Analytics KS6800A and automation of Dataset import (e.g., Result Listener). The Eggplant toolset and PathWave® Measurement Analytics can be deployed either locally or operate on a webserver. An Eggplant Control package, a PathWave® Measurement Analytics package and a UXM E7515B package which are based on C# and Python may be installed by user. Now the user can create test sequences (test plans) which will be run by machine in an automated way.

Figure 2:
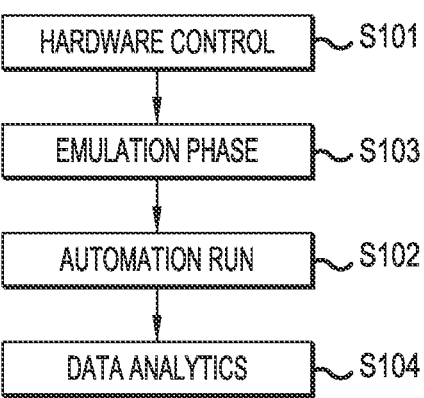
FIG. 2 is a flowchart illustrating a configuration workflow according to embodiments of the inventive concepts.

Referring to the flowchart of FIG. 2, the whole workflow might consist of the following primary steps.

S101—Hardware control. This step entails establishing connection and control over the 5G Network Emulator (E7515B) and device-under-test (5G User Equipment) using LAN and USB interfaces.

S102—Emulation phase. This step includes reproducing a specific use case scenario by emulating a 5G network and application-based user activities on the UE. In the description that follows, as examples, a C8700200A UXM Test Application (which may be referred to simply as C8700200A) is used for 5G network emulation, and a Vysor® screen mirroring tool is used to mirror the screen of the UE.

S103—Automation run. This step includes running Test Automation with KS8400B (based on OpenTAP® and plugins mentioned below) and the Eggplant Tool (using AI-based algorithms to navigate through the application settings and predefined scripts).

S104—Data analytics. Here, data visualizing and analyzing associated measurement data to track KPIs and find correlations are carried out.

Next, running of the automation and analytics framework according to embodiments of the inventive concept will be described.

Figure 3:
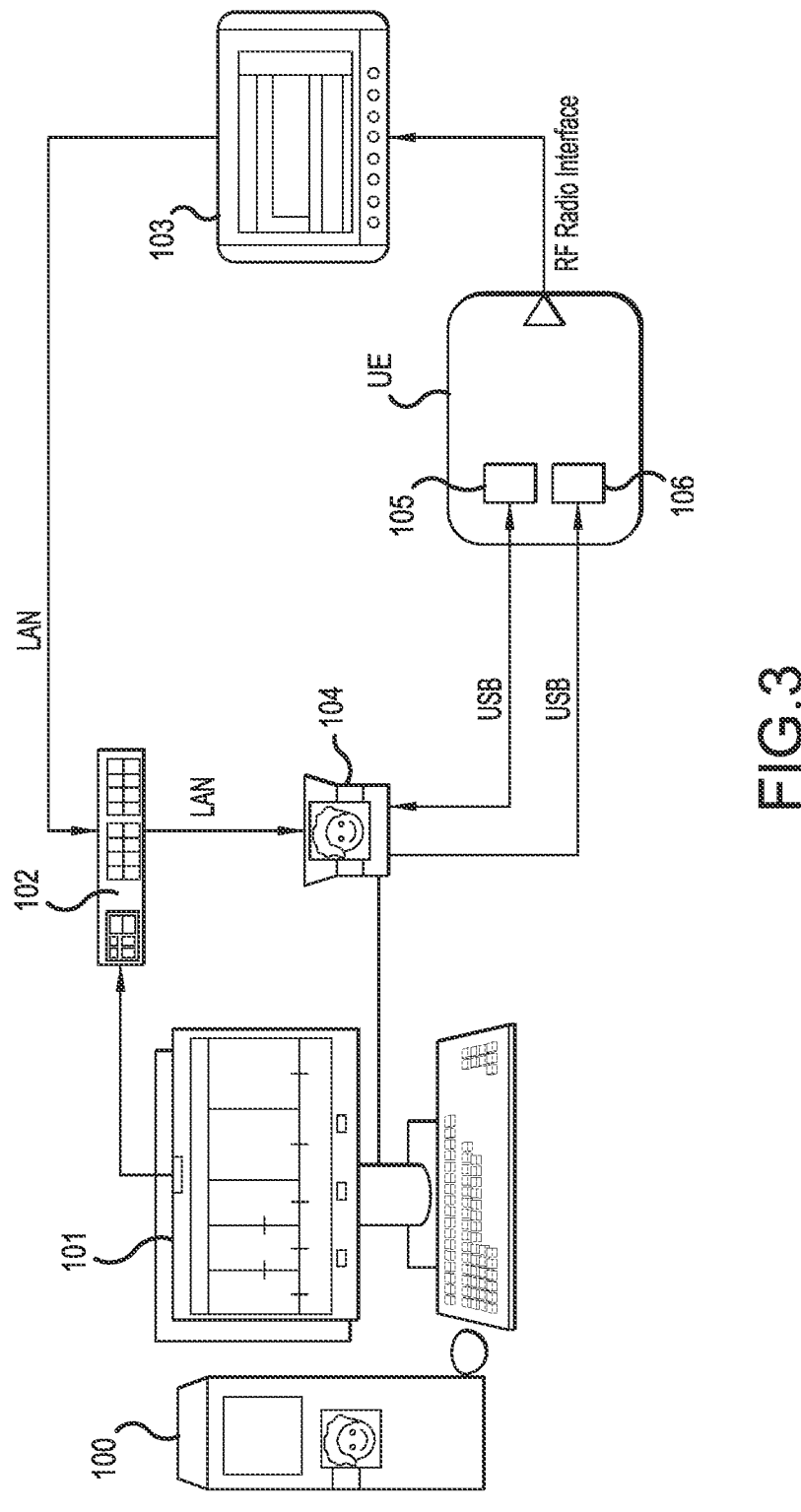
FIG. 3 is schematic diagram of a test setup according to embodiments of the inventive concepts.

Initially, the user sets up a test bench, an example of which is schematically shown in FIG. 3. As shown, the test bench of the illustrated example includes a computer 100 (e.g., a PC) having a display 101, a network switch 102, a network emulator 103, and an Eggplant gateway 104, operatively connected in a local area network (LAN). As noted above, The Eggplant toolset (and PathWave® Measurement Analytics) can be deployed either locally on the computer 100 or operate on a webserver. In the example of the present embodiments, the user sets up bench settings in KS8400B and ensures E7515B and the user equipment (UE) are connected to each other according to the diagram. The example test bench setup supports both iOS (105) and Android (106) UE automation as represented in FIG. 3. The Android device 106 can be controlled by Eggplant or by using an Android Debug Bridge (ADB). The iOS device 106 can be controlled by Eggplant.

Figure 4:
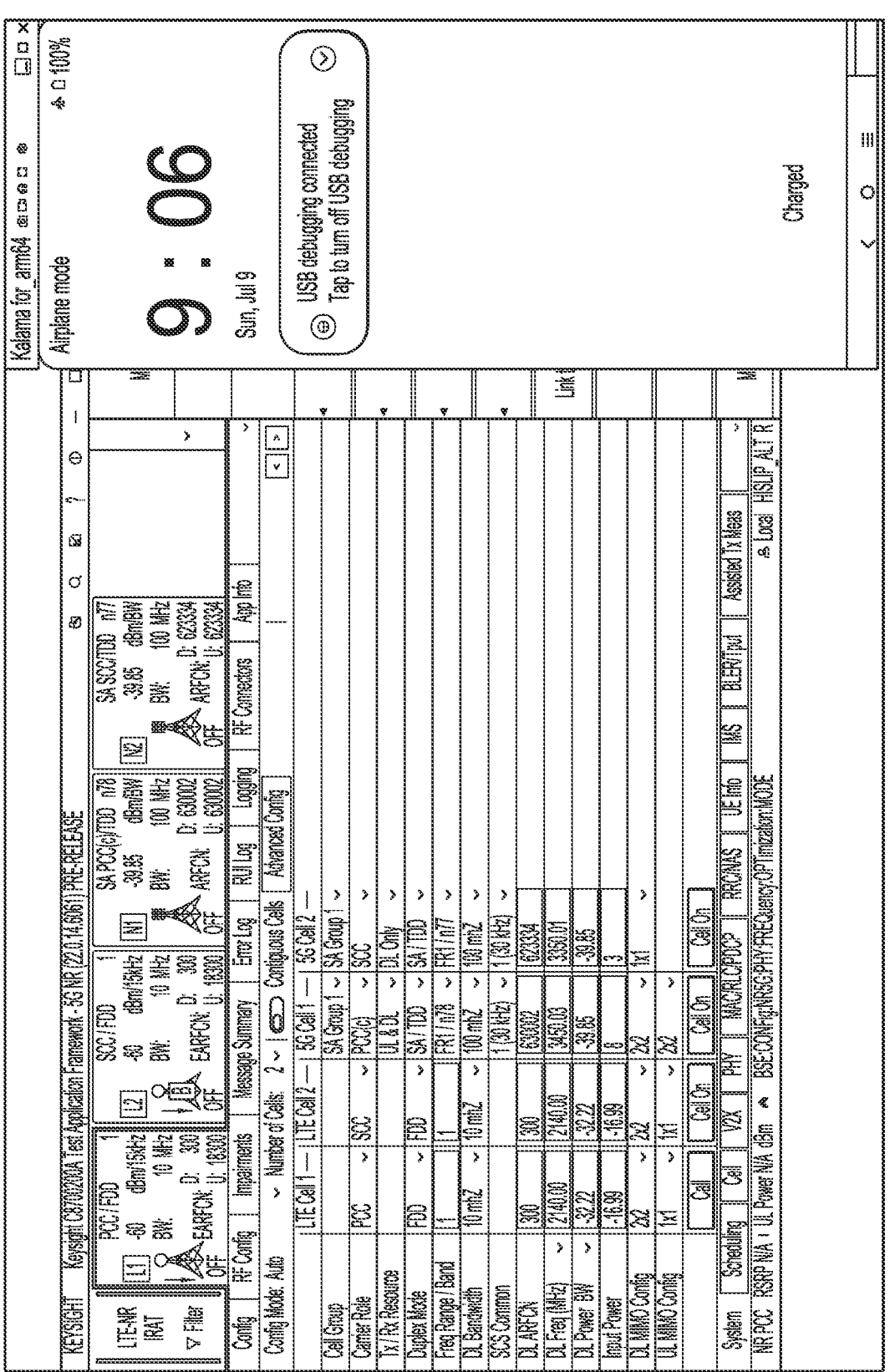
FIG. 4 shows an example screen shot including a mirror of the user equipment (UE) screen.

After the test bench is fully configured and USB/LAN addresses are correct, the user ensures C8700200A is operable as well as a PC-based Vysor application such as Vysor which mirrors the UE screen. An example screen shot is shown in FIG. 4, with the mirror of the UE screen to the right of the display screen.

Next, the user creates a test plan in KS8400B with test steps provided with UXM E7515B Control, Eggplant Control and PathWave® Measurement Analytics Result Listener plugins to reproduce the following example test algorithm:

a. Open SCPI-based connection to C8700200A Application with Path Wave® Test Automation KS8400B to load a network configuration, control network parameters and start tracking C8700200A/E7515B specific parameters in the background using Result Listeners;

b. Connect to a device-under-test to turn off airplane mode (can be done via ADB or Eggplant Gateway);

c. After the network is initialized and UE is attached-run Eggplant script and track application-related metrics;

d. When the first Eggplant script is completed, new changes can be applied to a network-such as format change, cell reselection, channel impairments, and so on;

e. Run Eggplant script to collect updated metrics;

f. Finalize the test by turning on UE airplane mode, powering off the cells and publishing test results to KS6800A database.

FIG. 5 illustrates an example test plan which emulates the change in network performance when the main cell is switched from LTE to 5G.

To integrate Eggplant with embedded Automation Intelligence functionality into the sequencing environment of KS8400B, the user should parametrize Eggplant test step to run the specialized script with the DUT name as a parameter: FIG. 6 illustrates an example in which Eggplant is used to test the network speed by running a SpeedTest Application installed on UE. The Eggplant Scripts is using SenseTalk architecture, and its contents are shown in FIG. 7.

Figure 8:
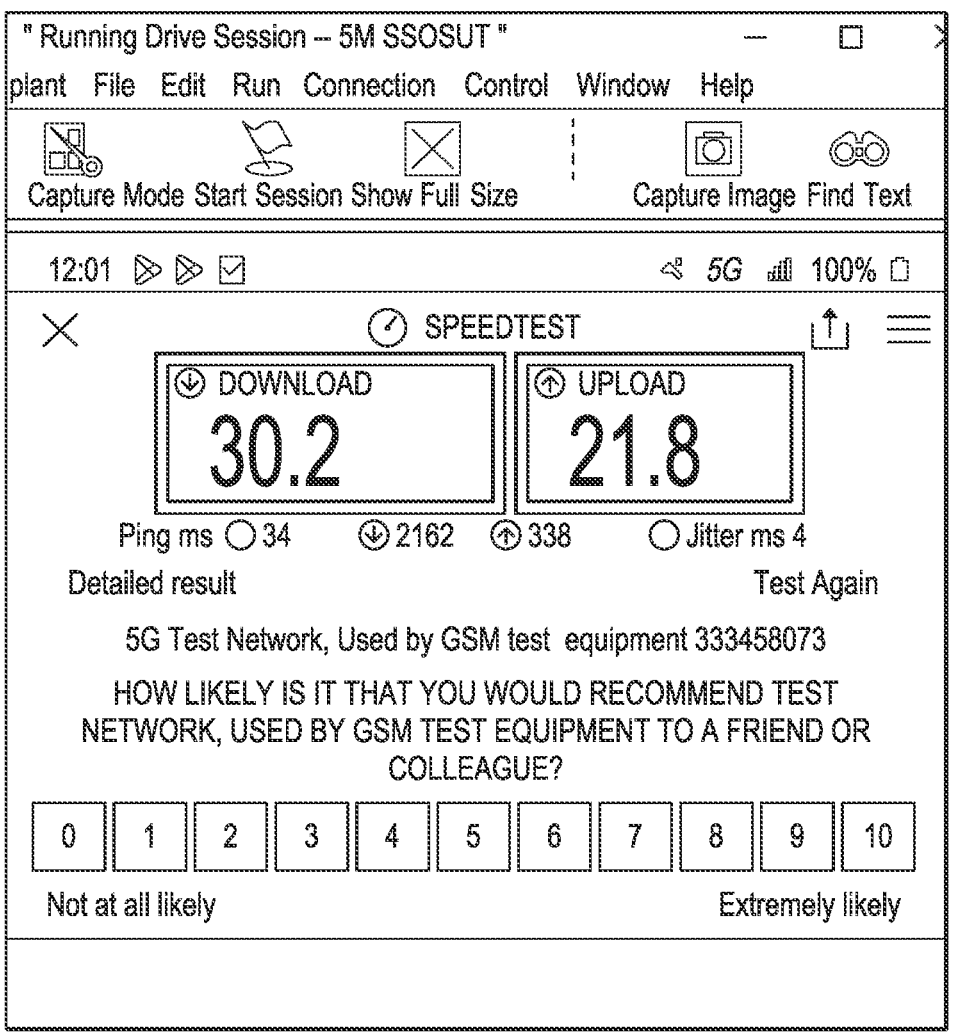
FIG. 8 illustrates an example of metric obtained in downlink and uplink speed tests.

During the Eggplant script, the AI-engine is analyzing the mirrored UE screen to collect some application-related metrics. In case of the SpeedTest application, these metrics are Downlink Speed and Uplink Speed as shown by the screenshot of FIG. 8. The AI-engine of the Eggplant tool reads these values and stores them after each script completion to a CSV log and to the Path Wave® Test Automation KS8400B service log.

The log information from KS8400B will contain not only Eggplant results but also network parameters from C8700200A application and UXM E7515B network emulator test-related information, including SCPI-commands to set up the correct LTE/5G networks parameters. The example test step activating 5G cell from KS8400B through SCPI-commands is shown in FIG. 9, and an example of the part of the log associated with cell configuration which illustrates hardware automation concept of KS8400B controlling C870020A and UXM E7515B is shown is shown in FIG. 10.

Some key properties of the network which are reasonably important to correlate application performance with network capabilities include but are not limited to cell type, access point name, DUT IP address, Gateway IP address, Mobile Country Code, Mobile Network Code, Downlink modulation coding scheme (MCS), uplink MCS, UE output power, and so on.

All these parameters are set during C8700200A initialization in the KS8400B test plan and can also be requested by SCPI commands as a part of the KS8400 test automation. Every response is also published in the final log/result with Eggplant log information added.

After the test run is completed, the new dataset in KS6800A is generated automatically by running Path-Wave® Measurement Analytics Result Listener in the background of KS8400B. This dataset may be displayed in a web-browser when accessing the KS6800A installation URL.

The dataset in consideration comprises data from several sources. Primarily, it contains data related to the 5G network based on C8700200A/UXM E7515B parameters related to the network properties. Secondly, it contains 5G User Equipment (UE) related data. This data may be predicated on speed test results harvested using the Eggplant Digital Automation Intelligence suite and assisted AI-engine tracking user interface metrics. Finally, it incorporates test and measurement metadata, which provides additional context to the measurements. These include details like the name of the test operator, KS8400B and Eggplant versions, location of the test, and other environmental or setup-specific parameters that may have a bearing on the tests.

Figure 11:
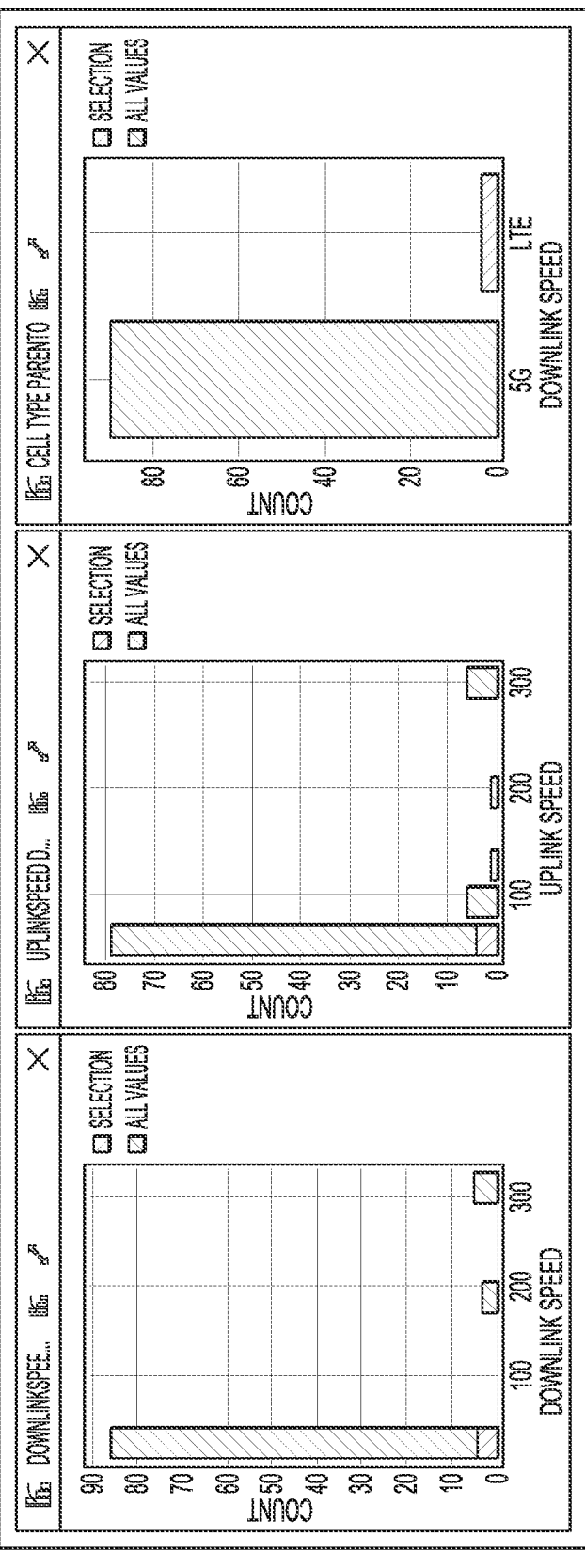
FIG. 11 illustrates an example in which uplink and downlink speeds are correlated with cell type.

An engineer can utilize this rich dataset to validate network performance comprehensively. For instance, the engineer can evaluate the uplink and downlink speeds using a popular network diagnostic tool such as the SpeedTest® application mentioned above. This is an effective way to measure bandwidth and ascertain if the network is performing optimally or if there are areas that require remediation. The speed measurements can further be correlated with other parameters. FIG. 11 illustrates an example in which uplink and downlink speeds are correlated with cell type.

Figure 12:
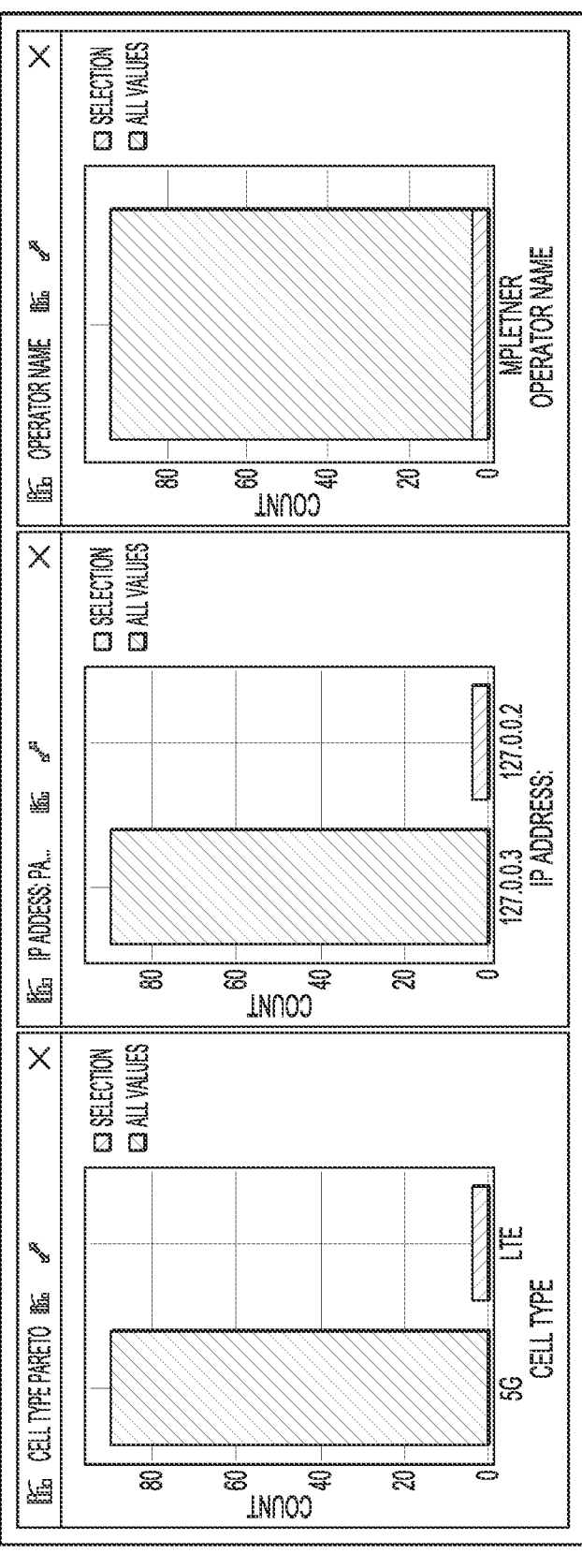
FIG. 12 illustrates an example in which correlations are made between an UE IP-address and network, and individual test operators' performance.

The coupling and correlation functionality of the KS6800A provides users with the ability to interrelate parameters with one another. As illustrated in FIG. 11, the network speed associated with the LTE cell is inferior to the performance of the simulated 5G cell. Additionally, given that the dataset is enriched by the fact that all measurement data is consistently collected with the KS8400B and Open-TAP, engineers can also scrutinize corresponding metadata values. This analysis can include correlations between the UE IP-address and network, or individual test operators' performance, as shown in the example of FIG. 12.

Figure 13:
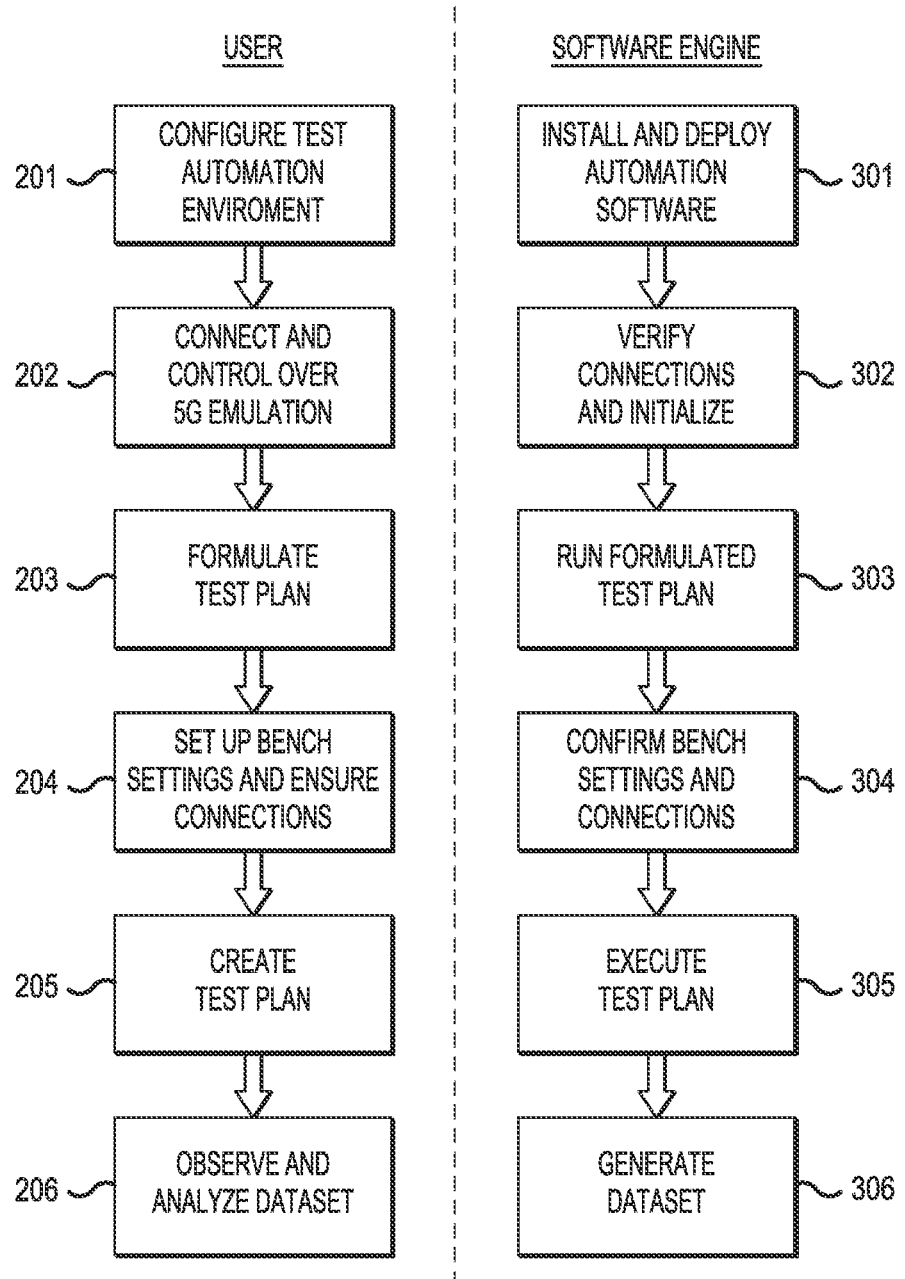
FIG. 13 is a chart illustrating a summary of the test operations carried out during the testing of an UE according to embodiments of the inventive concept.

FIG. 13 is a chart illustrating a summary of the test operations described above. In particular, the chart illustrates how the user and the KS8400B OpenTAP engine (representing the machine or automated system) collaborate to execute and complete the entire testing and measurement process according to the description above.

Referring to FIG. 13, at 201, the user configures the PathWave® Test Automation environment using the Open-TAP core engine, ensuring interoperability with necessary tools.

At 301, the KS8400B OpenTAP engine installs and deploys the development version of PathWave® Test Automation and any required packages.

At 202, the user establishes connection and control over the 5G Network Emulator and UE.

At 302, the KS8400B OpenTAP engine verifies connections and initializes relevant processes.

At 203, the user formulates a test plan to reproduce a specific use case scenario.

At 303, the KS8400B OpenTAP engine runs the formulated test plan based on the given sequence, incorporating the use of plugins and AI-based algorithms.

At 204, the user sets up bench settings in KS8400B and ensures E7515B and UE are connected (e.g., as shown in FIG. 3).

At 304, the KS8400B OpenTAP engine checks and confirms the successful setup of bench settings and connections.

At 205, the user creates a test plan in KS8400B to reproduce the desired algorithm using the provided plugins.

At 305, the KS8400B OpenTAP engine executes the test plan as per the user's direction, integrating the use of the Eggplant tool and the Path Wave® Measurement Analytics Result Listener.

At 206, the user visualizes and analyzes the generated dataset in KS6800A.

At 306, the KS6800B OpenTAP engine automatically generates a dataset post-test, ready for the user to visualize and analyze.

The toolset of the inventive concepts as describe above is geared to gather and process a diverse data array. This includes 5G network emulator logs, 5G User Equipment (UE) application KPIs, and measurement hardware physical layer parameters. Consequently, the suite amplifies traditional functional testing with comprehensive low-level data.

The embodiment described above can be enhanced to increase the utility, flexibility, and comprehensiveness of the system, delivering even greater value to users and extending its applicability to a wider range of use cases. For example, the system could be developed to control additional hardware components. For example, the incorporation of power supplies, spectrum analyzers, and other testing equipment could provide more comprehensive testing capabilities and yield more granular data. Further, the system could be enhanced to conduct more sophisticated tests and capture a wider range of user KPIs. For instance, it could automate the process of sharing and verifying access points, or track other user KPIs such as call quality, message delivery, and more.

Another enhancement could be extending the compatibility of the system to include more device-under-tests (DUTs). This could include not only phones without ADB control, such as iPhones, but also any other mobile OS which can be mirrored on Test PC to provide a more inclusive testing environment. It also represents the diversity of user devices in real-world conditions. In addition, the framework could be augmented to interact with any user-installed application, exploiting Eggplant's capabilities for simulating and tracking UX/UI performance. This could allow more granular, application-specific performance assessments, enhancing the depth of user experience insights and broadening testing scenarios.

It is further noted that the functional blocks, components, systems, devices, and/or circuitry described herein can be implemented using hardware, software, or a combination of hardware and software. For example, the disclosed embodiments can be implemented using one or more programmable integrated circuits that are programmed to perform the functions, tasks, methods, actions, and/or other operational features described herein for the disclosed embodiments. The one or more programmable integrated circuits can include, for example, one or more processors and/or PLDs (programmable logic devices). The one or more processors can be, for example, one or more central processing units (CPUs), graphic processing units (GPUs), controllers, microcontrollers, microprocessors, hardware accelerators, ASICs (application specific integrated circuit), and/or other integrated processing devices. The one or more PLDs can be, for example, one or more CPLDs (complex programmable logic devices), FPGAs (field programmable gate arrays), PLAs (programmable logic array), reconfigurable logic circuits, and/or other integrated logic devices. Further, the programmable integrated circuits, including the one or more processors, can be configured to execute software, firmware, code, and/or other program instructions that are embodied in one or more non-transitory tangible computer-readable mediums to perform the functions, tasks, methods, actions, and/or other operational features described herein for the disclosed embodiments. The programmable integrated circuits, including the one or more PLDs, can also be programmed using logic code, logic definitions, hardware description languages, configuration files, and/or other logic instructions that are embodied in one or more non-transitory tangible computer-readable mediums to perform the functions, tasks, methods, actions, and/or other operational features described herein for the disclosed embodiments. In addition, the one or more non-transitory tangible computer-readable mediums can include, for example, one or more data storage devices, memory devices, flash memories, random access memories, read only memories, programmable memory devices, reprogrammable storage devices, hard drives, floppy disks, DVDs, CD-ROMs, and/or any other non-transitory tangible computer-readable mediums. Other variations can also be implemented while still taking advantage of the client monitor application pre-classification techniques described herein.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention shown and described herein are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A system for testing a cellular device under test (DUT), comprising:

a display device for displaying a mirror image of a screen of the cellular DUT;

a network emulator configured to emulate a cellular network while in communication with the cellular DUT;

a sequencer engine module, including a graphical user automated testing interface displayed on the display device together with the mirror image of the screen of the cellular DUT, configured to control the network emulator and the cellular DUT, to automatically run a sequence of test commands on the cellular DUT, and to automatically run user emulation scripts;

a user emulation module configured to emulate a graphical user interface of the DUT by generating the user module scripts according to the sequence of test commands; and a data analytics module configured to generate display data of measurement results of the DUT on the display device.

2. The system of claim 1, wherein the user emulation module is configured to scan the mirror image of the screen of the DUT for specified input graphics, and to selectively activate the specified input graphics on the DUT according to the user emulation scrips.

3. The system of claim 2, wherein the user emulation module is further configured to scan the mirror image of the screen of the DUT for test results applied to the data analytics module.

4. The system of claim 1, wherein the DUT is an Android device which is controllable by either the sequencer engine module or the user emulation module.

5. The system of claim 1, wherein the DUT is an IOS device controlled by the user emulation module.

6. The system of claim 1, further comprising a test computer including the display.

7. The system of claim 6, wherein the sequencer engine module, the user emulation module and the data analytics module are loaded in memory of the test computer.

8. The system of claim 7, wherein the sequencer engine module is loaded in memory of the test computer, and the user emulation module and the data analytics module are on a webserver.

9. A non-transitory computer readable medium having stored thereon executable instructions embodied in the computer readable medium that when executed by at least one processor of a computer cause the computer to perform steps to test a cellular device under test (DUT), wherein the executable instructions include a sequencer engine module, a user emulation module, and a data analytics module, wherein the sequencer engine module includes a graphical user automated testing interface to be displayed on a display device together with a mirror image of a screen of the cellular DUT, and when executed by the at least one processor, controls the network emulator and the cellular DUT, automatically runs a sequence of test commands on the cellular DUT, and automatically runs user emulation scripts;

wherein the user emulation module, when executed by the at least one processor, emulates a graphical user interface of the DUT by generating the user emulation scripts according to the sequence of test commands; and wherein the data analytics module, when executed by the at least one processor, generates display data of measurement results of the DUT on the display device.

10. The non-transitory computer readable medium of claim 9, wherein the user emulation module, when executed by the at least one processor, scans the mirror image of the screen of the DUT for specified input graphics, and to selectively activates the specified input graphics on the DUT according to the user emulation scrips.

11. The non-transitory computer readable medium of claim 10, wherein the user emulation module, when executed by the at least one processor, further scans the mirror image of the screen of the DUT for test results applied to the data analytics module.

12. The non-transitory computer readable medium of claim 9, wherein the DUT is an Android device which is controllable by either the sequencer engine module or the user emulation module.

13. The non-transitory computer readable medium of claim 9, wherein the DUT is an IOS device controlled by the user emulation module.

* * * * *